United States Patent [19]

Coleman

[11] 4,330,182

[45] May 18, 1982

[54] METHOD OF FORMING SEMICONDUCTING MATERIALS AND BARRIERS

[75] Inventor: John H. Coleman, Locust Valley, N.Y.

[73] Assignee: Plasma Physics Corporation, Locust Valley, N.Y.

[21] Appl. No.: 138,699

[22] Filed: Apr. 9, 1980

Related U.S. Application Data

[63] Continuation-in-part of Ser. No. 857,690, Dec. 5, 1977, Pat. No. 4,226,897.

[51] Int. Cl.³ .......................................... H01L 45/00
[52] U.S. Cl. .......................................... 352/2; 16/61
[58] Field of Search .............................. 357/2, 16, 61

[56] References Cited

U.S. PATENT DOCUMENTS

| | | | |
|---|---|---|---|
| 4,064,521 | 12/1977 | Carlson | 357/2 X |
| 4,069,492 | 1/1978 | Pankove | 352/2 X |
| 4,142,195 | 2/1979 | Carlson | 357/2 X |
| 4,162,505 | 4/1978 | Hanak | 352/2 X |
| 4,196,438 | 4/1980 | Carlson | 357/2 X |
| 4,202,928 | 5/1980 | Staebler | 357/2 X |
| 4,217,148 | 8/1980 | Carlson | 357/2 X |
| 4,251,229 | 2/1981 | Monstakas | 352/2 X |
| 4,266,984 | 5/1981 | Wronski | 357/2 X |

OTHER PUBLICATIONS

Brodsky, *IBM Tech. Bull.*, vol. 17, No. 6, Nov. 1974 pp. 1814–1816.

*Primary Examiner*—Martin H. Edlow

[57] ABSTRACT

Photovoltaic junctions useful for solar energy conversion and for electrophotographic image formation are fabricated from a layer of amorphous boron in contact with a layer of amorphous silicon. The amorphous boron is preferably deposited at a reduced temperature on the amorphous silicon; or, alternatively, the amorphous silicon is deposited on a boron-bearing body previously deposited on an opaque metallic substrate.

37 Claims, 9 Drawing Figures

4,330,182

METHOD OF FORMING SEMICONDUCTING MATERIALS AND BARRIERS

BACKGROUND OF THE INVENTION

This is a continuation-in-part of application Ser. No. 857,690, filed Dec. 5, 1977, now U.S. Pat. No. 4,226,897.

The present invention relates to semiconductor devices, and more particularly to improved processes and apparatus for producing photovoltaic junctions, rectifying junctions, and image-forming devices.

Hydrogenated amorphous silicon films, hereinafter called a-Si:H, which are suitable for semiconductor devices, have been prepared by a variety of techniques. Chittick, Alexander, and Sterling reported in the *Journal of the Electrochemical Society*, Vol. 116, No. 1 (January 1969) pages 77–81, in an article entitled "The Preparation and Properties of Amorphous Silicon", that an inductively coupled, RF glow-discharge in silane ($SiH_4$) gas produced low-conductivity a-Si:H films that could be doped with both donor and acceptor impurities, thereby changing the a-Si:H conductivity over a wide range of values. More recently, a-Si:H films were produced by evaporating silicon in an atmosphere of $H_2+Ar$, which exhibited similar semiconductor characteristics to those films made from silane in a glow-discharge.

Originally a-Si:H was synthesized by a glow-discharge in $SiF_4$ and $H_2$ by a group under my supervision, and the material, per se, was disclosed in UK Pat. No. 933,545, published Aug. 8, 1963 (expired). The excellent dielectric properties and the high resistivity values of a-Si:H were tabulated on page 4 of this patent. High resistivity a-Si:H is particularly suited as one component of the junctions described herein.

Recently, U.S. Pat. No. 4,064,521, issued to D. J. Carlson on Dec. 20, 1977, described photovoltaic junctions composed of glow-discharge deposited P-type, N-type, and intrinsic a-Si:H. Carlson used the gaseous dopants, diborane and phosphene mixed with silane to volume ratios of ½ to 5%, described earlier in the Chittick et al publication cited above.

Similarly, UK Patent Application No. 2,018,446, published Oct. 17, 1979, describes various image-forming devices, some of which have a junction composed of two layers of a-Si:H, one layer being a different conductivity type from that of the other layer. Protective and blocking layers for the a-Si:H were also described.

In another variation, a vidicon image-forming device fabricated with sputtered a-Si:H was described by Y. Imamura et al in *Applied Physics Letters*, Vol. 35 (4), Aug. 15, 1979, on pages 349–351, in an article entitled "Photoconductive imaging using amorphous silicon film".

Finally, it is well established in the semiconductor art that boron ions accelerated to a high velocity may be implanted into Si wafers as dopants. Dopant ions were implanted in crystal-Si by means of a corona discharge as described by R. Wichner and E. J. Charlson in an article entitled "Silicon Solar Cells Produced by Corona Discharge", published in *Journal of Electronic Materials*, Vol. 5, No. 5, 1976, on pages 513–529. Significantly, Wichner & Charlson state on page 518 that the discharge must remain in the corona mode so that interelectrode voltages of several kilovolts can be maintained. They further teach that high-energy, multiple-charged ionic species are necessary to attain sufficient implantation depth (range), and they specifically exclude the glow-discharge mode since the voltage, and consequently B ion energy, is too low for useful implantation depth.

SUMMARY OF THE INVENTION

A semiconductor device having a semiconductor junction between a body containing boron and a body of hydrogenated amorphous silicon into which diffusion of the boron is restricted.

DESCRIPTION OF THE APPARATUS AND TECHNIQUES

Figure 1:
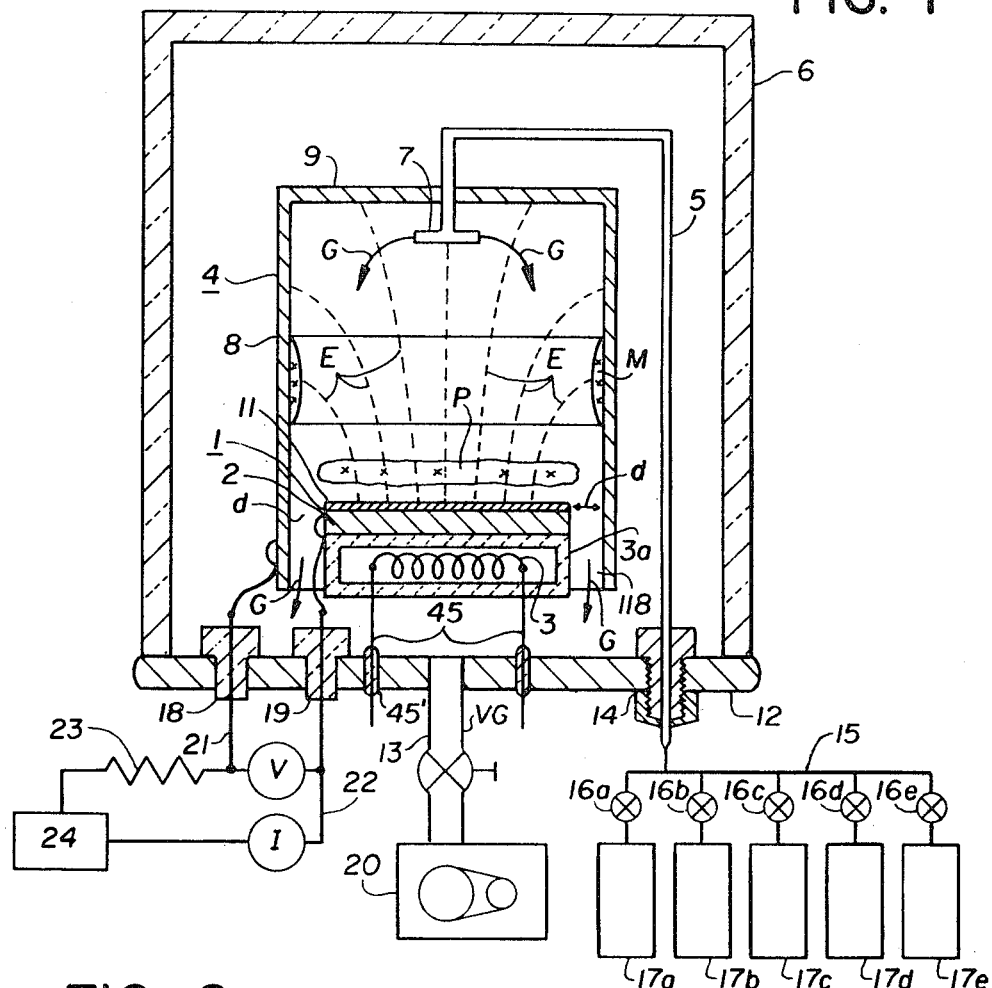
FIG. 1 is a schematic view of a first apparatus for glow-discharge-deposition and doping of amorphous boron, amorphous silicon and amorphous carbon.
Figure 2:
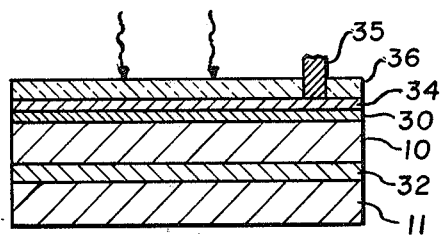
FIG. 2 is a cross-sectional view of a M/NIP semiconductor device representing the first embodiment of the present invention.

Referring to FIG. 1, schematic views are illustrated of the glow-discharge apparatus for producing intrinsic (I), P-type and N-type a-Si:H coatings on a metallic surface M. A typical PIN/M photovoltaic device made therein is illustrated in FIG. 2. The substrate 1 is a 0.010" thick stainless-steel plate 11 with rectangular dimensions of 3"×4" supported by electrode 2. A resistance heater 3 is embedded in a ceramic block 3a which supports and heats the electrodes 2, 11. Substrate 11 is positioned in the open face of concave counter electrode 4 which has a rectangular cross-section of 4"×5" defined by side-walls 8 and top 9. Top 9 is positioned about 4½" above the front surface of substrate 11. Electrode assemblies 1 and 4 are positioned inside an enclosure 6 and header 12 and are joined by appropriate gasket to form a gastight seal. A vacuum pump 20 is connected through valve and nipple 13 to header 12 to evacuate enclosure 6. Gases G from tanks 17 a-e are conducted through regulated needle valves 16 a-e, a manifold 15, and a connector 14 through the header 12 into insulating enclosure 6. Here the gases G are conducted through dielectric tubing 5 and a diffuser 7 inside the electrode 4. A gap 118 of, say, ¼" between the walls 8 and the electrode 2 permits egress of gases G after passing through a glow-discharge plasma P. A gauge VG meters the pressure of the gases G in the enclosure 6 and is preferably of the capacitance-manometer type which is commercially available for use with corrosive, condensable gases in the range of 0.001 to 10 torr. A signal from the gauge VG may automatically regulate the valves 16 through a servo-mechanism to maintain a desired pressure. A potential V is applied between electrodes 2 and 4 from power supply 24 by leads 21, 22 connected through insulated electrical bushings 18, 19 sealed in the header 12. A protective resistor 23 prevents damaging spark currents. Voltage V and current I are metered as indicated. The resistance heater 3 is connected through leads 45 and insulating bushings 45' to a controlled power source (not shown).

In operation, the enclosure 6 is evacuated by the pump 20 to a pressure below about 0.02 torr and the heater 3 adjusted to maintain the substrate 11 at a temperature of 180°-400° C. Enclosure 6 is back-filled with silane ($SiH_4$) from tank 17a by opening valve 16a. Valve 16a is adjusted to maintain the desired pressure in the enclosure 6 which, for example, may be 0.5 torr. Next, a mixture of 1% phosphine ($PH_3$) in helium from tank 17b is admitted into manifold 15 where it mixes with the silane and flows through lines 5, 7 to raise the system pressure PG to a range of 1-2 torr. The potential difference V between the electrodes 2 and 4 is adjusted to a range of 200-500 volts, initiating a glow-discharge, and the current I is adjusted to about 5 mA to position the glow-discharge distance plasma P in the region above plate 11, thereby producing a uniform, heavily doped N ohmic layer 32 on the substrate 11 (FIG. 2). After maintaining the discharge for about 2 minutes, the valve 16b is closed to shut off the flow of $PH_3$ and He, leaving the silane alone.

As the uniformity and impurity level of the N-type ohmic layer 32 is not as critical as that of the intrinsic (I) a-Si:H layer 10, the ohmic layer 32 may be deposited thermally without a glow-discharge. For example, a conventional chemical-vapor-deposition (CVD) apparatus filled with $PH_3/SiH_4$ in He carrier gas may be used to deposit the N-type layer 32 prior to insertion of the substrate in the apparatus of FIG. 1. However, it is important to maintain the CVD temperature below the value where poly-crystallites form on a macro-scale and produce surface roughness which is damaging to the a-Si:H layers deposited subsequently.

Next, to produce the I a-Si:H layer 10 onto the top surface of the N layer 32, the temperature of substrate 11 is maintained in the range of 180°-410° C. by heater 3 and the pressure PG of silane alone is adjusted to 0.1 to 0.4 torr. If He carrier gas is used, PG is adjusted to about 2 torr. The voltage V is adjusted to the 500 to 1500 volt range depending on PG and the current to about 5 mA to initiate the discharge in the strong electric field Es in the gap G between the electrodes 2 and 4 and to position the diffuse plasma P in the weak electric field Ew adjacent substrate 11, thereby minimizing the possibilities for sparking to substrate 11. The discharge is maintained for about 40 minutes to produce about one micron of a-Si:H layer 10. A longer discharge time, a higher current, or disilane may be used to increase thickness of the layer 10. After the desired thickness of the layer 10 is attained, the voltage V is removed, the valve 16b is closed and the residual gases evacuated by the pump 20.

Next, to complete the formation of the M/NIP junction, a P-type layer 30 of hydrogenated, amorphous boron (a-B:H) is glow-discharge deposited on the top surface of the I a-Si:H layer 10 by introducing diborane ($B_2H_6$) and He into the plasma P. First, valve 16c is opened to admit the $B_2H_6$/He gases to a pressure PG in the range of 1-2 torr and the temperature of substrate 11 is maintained in the range of 180°-410° C., as was used in the formation of layers 10, 30. The voltage V is adjusted to 200-500 volts to position the glow-discharge plasma P in the weak field region Ew over the substrate 11. The current is maintained at about 5 mA for 2 minutes to produce a thickness of about 100A of a-B:H, while the temperature of substrate 11 is maintained in the range of 180°-410° C., as desired for a-Si:H layer 10 deposition temperature. Next, the voltage V is removed, the valve 16c is closed, and the valve 16d is opened to introduce nitrogen to purge residual diborane from enclosure 6. The current to heater 3 is disconnected and, after cooling for about one hour, the enclosure 6 is opened to air to remove the substrate 11.

To complete the fabrication of an M/NIP photovoltaic device, a semitransparent metallic layer 34 of a material such as 100A Pd, Cr, Cr-Cu, or an alloy of Ni-Cr, is thermally evaporated on the a-b:H layer. Metallic fingers 35 are thermally evaporated in the same vacuum deposition system on semitransparent layer 34 for electrical contact. For use as a photodiode or solar cell, an antireflection (AR) coating 36 of a material such as $TiO_2$, or a conducting metal oxide (CMO) such as $SnO_2$, indium tin oxide (ITO) or zinc oxide, is deposited over metallic layer 34.

After deposition, the electrical properties of the M/NIP cell were tested with various light sources. Under AM1 solar illumination, the short circuit current Isc of a typical cell was measured to be 4 mA/cm² and the open circuit voltage Voc was measured to be 0.45 volts using a Cr/Ni alloy semitransparent electrode 34. As the electrode transmitted only about 30% of the incident photon flux, the internal current, if full AM1 illumination were applied without electrode absorption and reflection losses, is calculated to be 4/0.3 or 13.3 mA/cm². This value of current is approximately the same as the best values reported in the literature when similar corrections are made for electrode losses; and, the measured Voc is comparable to published values with similar low work-function electrodes.

Next, a second M/NIP cell is made in the same sequence of process steps using the apparatus of FIG. 1 as described above, but the heater 3 is disconnected after depositing the I a-Si:H layer 10 in order to deposit the a-B:H layer 30 at a lower temperature than that used to deposit the a-Si:H layer 10. The temperature of electrode 11 and consequently the a-Si:H layer 10 is then decreased for about 1 hour from 200°-300° C., to around 100° C., after which time the a-B:H layer 30 is glow-discharge deposited for about 2 minutes on the layer 10 under the process conditions described above for the first cell, but at the lower temperature. After purging the diborane gas, the substrate 11 is removed from enclosure 6 without further cooling and is tested for its image forming properties, as described later in connection with FIG. 7, and for photovoltaic properties after adding semitransparent electrode 34.

Again, to form a photovoltaic solar cell, a semitransparent metallic coating 34 and contact fingers 35 are evaporated thermally on the a-B:H layer 34 in the same vacuum deposition system as used for the first M/NIP cell; and, the completed second M/NIP cell tested under solar radiation, with and without AR coating 36. Under test using AM1 solar photon flux, but without AR coating 36, the Voc was measured to be 0.65V and the current to be 4mA/cm². Thus, when the a-B:H layer 34 is deposited at a low temperature, the Voc increases by about 0.2 volts over that produced by the first M/NIP cell where the a-B:H layer was deposited without reducing the temperature of substrate 11.

Although my discovery cannot be explained theoretically at this time, one possibility appears to be that the lower temperature of substrate 11 reduced the damage by glow-discharge bombardment of the a-B:H layer 30 to the surface of the I a-Si:H layer 10. The a-B:H layer 30 appears to be a P-type semiconductor when deposited on a cold substrate and forms a P-N heterojunction against the undoped I a-Si:H layer 10, which is slightly N-type as deposited. As the depletion region forms inward into the I a-Si:H layer 10 from its interface with the a-B:H layer 30, the top surface of the a-Si:H layer 10 is most critical. To test the amount of B diffusion in the first M/NIP cell, its chemical composition was analyzed by a mass spectrograph.

Figure 4:
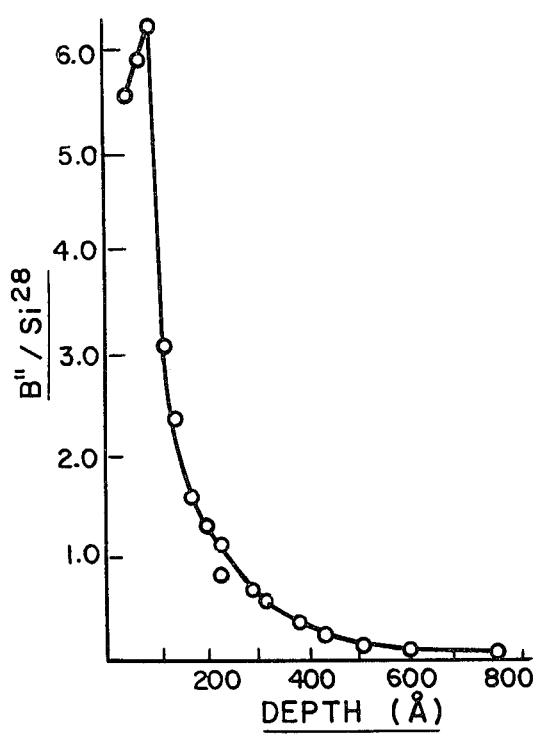
FIG. 4 is a graph showing the boron/silicon ratio in an amorphous boron/amorphous silicon junction.

Referring now to FIG. 4, the boron/silicon ratio of a-Si:B layer 30 and its interface with the a-Si:H layer 10 glow-discharge deposited at 300° C., was analyzed by Secondary Ion Mass Spectrometry (SIMS) using a commercially available system. As seen, the ratio of the $B''/Si^{28}$ isotopes decreased rapidly for about 100A and then decreased gradually for another 500A to background noise. The first 100A appears to represent the a-B:H with some interdiffusion of Si, while the 500A tail indicates a diffusion gradient of B into Si, although this diffusion is greater than expected from published B diffusion data taken without the presence of a glow-discharge. Some implantation of the B-bearing ions in the glow-discharge may also occur, and $SiB_6$ alloy may be formed.

However, the increase in Voc with the low deposition temperature of the a-B:H P-type layer 30, which would eliminate thermal diffusion of B into the a-Si:H layer 10, is contrary to that expected since it is an established industrial practice in the semiconductor art to diffuse thermally B-dopants into crystal-Si to produce graded P-N junctions. No data appears to exist on semiconducting properties of a-B:H films deposited in the temperature range I have employed, since the a-B:H film 10 peels off most other surfaces when deposited significantly below 180° C.

Figure 3:
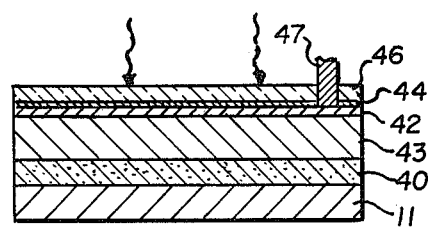
FIG. 3 is a cross-sectional view of a M/PIN semiconductor device representing the second embodiment of the invention.

Referring to FIG. 3, a M/PIN photovoltaic junction device is illustrated in cross-section having an a-B:H layer 40 deposited first on the 0.010″ thick stainless steel substrate 11, followed by the I a-Si:H layer 43 and N-type a-Si:H layer 42. The glow-discharge deposition system described in connection with FIG. 1 may be used for depositing the P-type, I and N-type layers 40, 43, 42 under the same process conditions used with the M/NIP junction, and described above in connection with FIG. 2, except that the present order of deposition was reversed. On cooling, the M/PIN cell is removed from the deposition system and tested both in the image-forming apparatus described later in connection with FIG. 7 and as a photovoltaic device.

To form a photovoltaic device, an electrode 44 may be added to establish electrical contact to N-type layer 42. A semitransparent layer 44 of 100A of Cr/Cu or a Ni-Cr alloy is evaporated thermally onto the N-type a-Si:H layer 42, as was done in the M/NIP cell of FIG. 2, except that electrode 44 is preferably made from a low work-function metal such as Cr, Al, Ti, etc. to produce highest Voc against N-type a-Si:H layer 42. An AR coating 46, which is preferably a conducting metal oxide such as, for example, tin oxide or zinc oxide, is deposited by standard production techniques onto electrode 44 and contact fingers 47 of Ti-Ag are added conventionally.

Under tests without the AR coating 46, the inverted M/PIN cell was found to produce an Isc of 4 mA/cm² when the a-B:H layer 40 was deposited on stainless steel substrate 11. As the optical transmission of the 100A Cr/N semitransparent top electrode is about 30% without an AR coating 46, the internal Isc is about 13.3 mA/cm², which is about the same output Isc as that produced in the M/PIN cell of FIG. 2. However, the Voc was measured to be 0.79 volts—a higher value than that produced by the M/PIN cell of FIG. 2, even when the low temperature was used for the a-B:H layer 30. Indeed, my Voc is comparable or higher than the Voc of 0.75 V reported by Hanak for Pt electrodes contacting a P-type a-Si:H in an article entitled "Monolithic Solar Panel of Amorphous Silicon" published in *Solar Energy*, Vol. 23, pages 145–147, 1979. Pt is expensive and relatively rare, while stainless steel is cheap and abundant. Although expensive metals are acceptable material costs for miniature electronic devices, the costs of all components are critical for large-area solar energy conversion devices.

Regarding deposition conditions, I found that the temperature of substrate 11 may be raised initially to facilitate deposition of the a-B:H layer 40 and then lowered to deposit the I a-Si:H layer 43 in the range of 180°–410° C. For example, the a-B:H layer 40 may be deposited by conventional CVD apparatus in which the temperature of substrate 11 is maintained at 300° C. to 600° C. in the presence of $B_2H_6$/He, cooled and transferred in air to the glow-discharge apparatus illustrated in FIG. 1. Indeed, I found that a mixture of $B_2H_6$/$SiH_4$ may be used to CVD the layer 40 on stainless steel substrate 11 and at temperatures up to about 600° C. and above, provided the CVD temperature is maintained below the value where polycrystallites form and produce surface roughness. The ratio of B/Si is preferably greater than .01.

Other suitable layers 40 on stainless steel substrate 11 are glow-discharge deposited, B-doped hydrogenated amorphous carbon a-C:H using a mixture of butadiene and $B_2H_6$ in the apparatus of FIG. 1. In any case, the B-doped layer 40 may be as thick as desired from physical and electrical considerations since the light enters oppositely through the N-type layer 42. However, in the case of glow-discharge deposited a-B:H layer 40, thickness greater than about 500A adds series resistance and peels from stainless steel substrate 11. In production, deposition of the P, I and N layers 40, 43, 42 is preferably made in-line by conveying substrate 11 through a series of deposition chambers while programming temperature, pressure and gas components.

Furthermore, the I a-Si:H layer 43 may be produced from other silanes such as disilane and by other deposition techniques such as, for example, thermally cracking gaseous $SiH_4$ and diffusing the Si-bearing fragments through a glow-discharge in $SiH_4$ or $H_2$ using, for example, apparatus such as that described later in FIG. 9. Other techniques for forming the a-Si:H layer 43 are described in my application Ser. No. 857,690, such as, for example, by sputtering Si in the presence of $SiH_4$ or $H_2$-Ar.

Referring back to the unexpectedly high Voc and Isc for the M/PIN cell described above, I can give no explanation based on accepted theory for these results. It is generally accepted in the art that the minority carriers generated only in the depletion region (around 0.3 microns) of the I a-Si:H layer 43 adjacent P-type layer 40 are collected as useful current Isc. However, in the present M/PIN cell, the photon flux transmitted by the semitransparent electrode 44 is absorbed by the intervening N-type layers 42 and the undepleted regions of the I a-Si:H. These regions are not expected to contribute any significant photo-current since the diffusion of holes in the regions outside the depletion region is reported widely in the art to be less than 0.1 micron. In my M/PIN cells, in contrast to expectations, the Isc output does not decrease even when the thickness of the I a-Si:H layer 43 is increased to 2 microns and falls only slightly when increased to 3 microns!

Next, a second M/PIN cell is fabricated by first depositing an a-Si:H doped with B as layer 40 on stainless steel substrate 11, using a glow-discharge in a gaseous mixture of 10% $B_2H_6$ in $SiH_4$ in He carrier at 2 torr by opening valves 16a, 16c as described in connection with FIG. 1. A 2 micron layer of a-Si:H and 200–400A of N-type a-Si:H are deposited sequentially forming layers 43, 42 on layer 40 to complete the M/PIN cell described in connection with FIG. 3. After evaporating semitransparent electrode 44 and testing under AM1 solar illumination, a high output Voc and Isc are measured similar to the first M/PIN with an a-B:H layer 40. However, the Isc output in the red portion of the spectrum is higher for the layer 40 made by co-deposition in $B_2H_6/SiH_4$ than for the a-B:H alone. Similar high output Isc and Voc are measured under illumination when P-type layer 40 is formed using B-doped a-Si:H and using hydrogenated amorphous carbon a-C:H. Thus, pre-deposition of the a B-bearing P-type layer on stainless steel followed by the a-Si:H layer 30 appears to produce improved properties even though the P-N junction is illuminated last.

Figure 5:
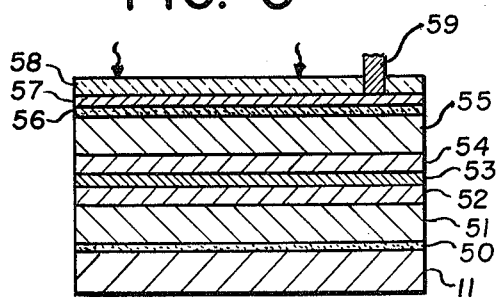
FIG. 5 is a cross-sectional view of a tandem semiconductor device representing the third embodiment of the invention.

Referring now to FIG. 5, photovoltaic devices illustrated in FIG. 2 and FIG. 3 are combined into tandem M/PIN/NIP junctions connected in parallel with a common semitransparent electrode 53. In the first stage an a-B:H layer 50 is deposited to a 200A thickness onto the stainless steel substrate 11 using, for example, the apparatus described in connection with FIG. 1. Next, a 2 micron thick intrinsic a-Si:H layer 51 and a 200A thick N-type layer 52 are glow-discharge deposited sequentially to form the M/PIN stage, as was described in connection with FIG. 3. A 100A thick Ni/Cr alloy electrode 53 is vacuum evaporated on the N-type layer 52, completing the first M/PIN stage. Alternatively, semitransparent electrode 53 may be a conducting metal oxide such as tin oxide with a thickness of 0.1 microns or greater.

Next, using the process conditions described in connection with FIG. 2, the M/NIP stage is formed by glow-discharge depositing the N-type layer 54 to a thickness of about 200A and then 1 micron of I a-Si:H 55. The P-type layer 56 of a-B:H is preferably deposited after cooling substrate 11 to about 100° C., as was done in the second M/NIP cell described in connection with FIG. 2. The a-B:H layer 50 on substrate 11 is preferably deposited at temperatures above 180° C.;, while the top a-B:H layer 55 is preferably deposited at a temperature below 180° C. to maximize Voc. Alternatively, layer 50 on the stainless steel substrate 11 may be B-doped a-Si:H with the B/Si ratio preferably greater than 0.1%.

Next, a semitransparent electrode 57, AR coating 58, and contact fingers 59 may be evaporated onto the a-B:H layer 56 as before. Suitable contact pads (not shown) may be added to connect electrodes 11, 57 in parallel without matching the current of each cell as is required with series connection used in prior art tandem devices.

Under AM1 solar illumination, the output Isc was at least 20% higher than for either cell alone. As photon flux that is not absorbed by the first PIN junction must pass through the second layer 52 and the inert portion of the I a-Si:H layer 51 to generate minority carriers in the depletion region in the a-Si:H layer 51 at the interface with the a-B:H layer 50, the output power and efficiency should be negligibly low. However, the second M/PIN junction extracts as much photon energy as if the P-type layer were irradiated first. Again, this result on the opaque electrode 11 is unexplainable if the depletion region remains 0.3 microns thick, as reported in the art.

Figure 6:
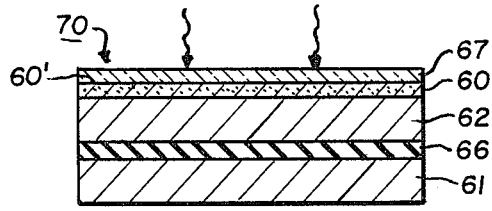
FIG. 6 is a cross-sectional view of an image-forming device representing the fourth embodiment of the present invention.

Referring to FIG. 6, an imaging device 70 is illustrated in cross-section in which an a-B:H layer 60 is deposited by glow-discharge with a free surface 60' for receiving an electrostatic charge. Here, an aluminum substrate 61, say 0.20" thick, is coated by a 0.25 micron $Si_3N_4$ dielectric layer 66 which is plasma deposited or evaporated conventionally. Next, a 10 micron a-Si:H layer 62 and a 100A a-B:H layer 60 are glow-discharge deposited on dielectric layer 66, using, for example, the glow-discharge apparatus of FIG. 1, in the temperature range of 180°–410° C. Alternatively, the a-Si:H layer 62 may be deposited in the temperature range of 30°–100° C. and annealed in the temperature range of 200°–250° C. In either case, deposition temperature is preferably maintained below 180° C. for depositing the a-B:H layer 60. Finally, a suitable protective organic coating 67 such as polyparaxylene may be deposited on layer 60.

Alternatively, the I a-Si:H layer 62 may be deposited by low-temperature CVD in silane/He provided the temperature is maintained below its macro-crystallization value and below the temperature where loss of $H_2$ reduces dark resistivity and photoconductivity. Other deposition techniques such as sputtering and evaporation, as described in my application Ser. No. 857,690, may be used, for example, to form the I a-Si:H layer 62, provided a suitable photoconductivity, dark resistivity, and reverse bias charging are characteristic of the material. The apparatus illustrated in FIG. 9 is particularly useful for forming images.

Figure 7:
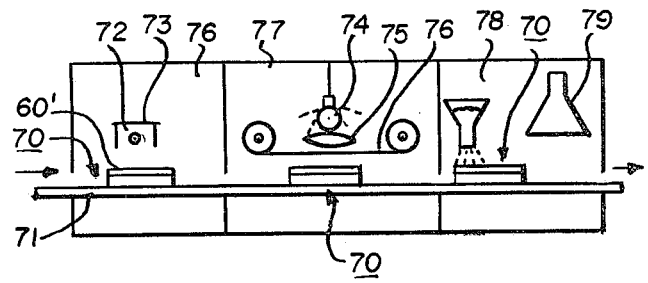
FIG. 7 is a schematic view of electrophotographic development apparatus.

Referring now to FIG. 7 which illustrates schematically electrophotographic apparatus, which may be used to form images on the junctions described herein such as, for example, the cell 70 illustrated in FIG. 5. The cell 70 is positioned on a conveyer 71 in a dark chamber 76 where a high negative surface potential is induced on the surface 60' of layer 66 (or on protective layer 63) by means of a corona charging wire 72 in a housing 73. Next, the cell 70 is conveyed into a second darkened chamber 77 where it is illuminated with light from a tungsten bulb 74, focused with a suitable lens system 75 through an interposed test object 76. The cell 70 is then conveyed to a development section 78 where toner (not shown) with suitable polarity, is applied (liquid or dry) and affixed with heat from lamp 79. Both liquid and dry toner formed excellent transfer patterns corresponding to the contour of the test object, and a conventional development electrode (not shown) was found to reverse the image.

Figure 8:
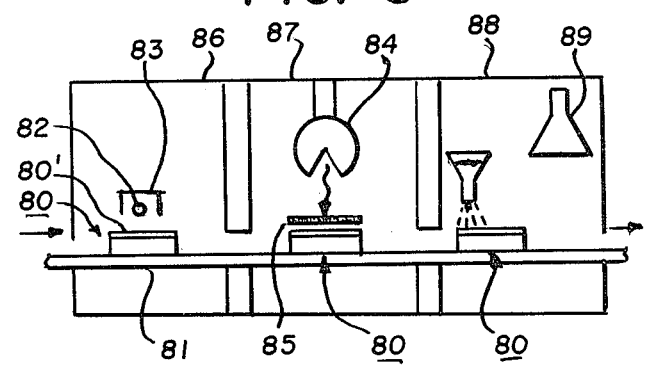
FIG. 8 is a schematic view of an X-ray electrophotographic apparatus representing the fifth embodiment of the invention.

Referring to FIG. 8, an X-ray point source 84 is used to induce an image on the surface 80' of a cell 80, such as, for example, the surface of the a-B:H layer 30 of the M/NIP cell illustrated in FIG. 2 without electrode 34 and AR coating 35. First, the a-B:H surface 80′ is charged negatively by high voltage corona wire 82 in electrostatic shield 83 positioned in dark chamber 86. After charging, cell 80 is moved by conveyer 81 from the chamber 86 to shielded chamber 87 and exposed to X-rays from the point source 84. The X-rays induce electrical conductivity in the I a-Si:H layer 10 and discharge the electrostatic charge on surface 80′. The induced conductivity and charge lost is a function of the X-ray radiation rate and exposure time. An interposed test object 85 reduces the X-ray rate and, correspondingly, decreases the loss of charge on the a-B:H layer 30. The cell 80 is then conveyed into chamber 88 where commercially available toner (dry or liquid) is applied (not shown) and fixed with heat from lamp 89. Alternatively, the M/PIN cell described in connection with FIG. 3 was found to accept a positive charge and also to form an excellent image of the interposed object 85 when appropriate toner was used.

Figure 9:
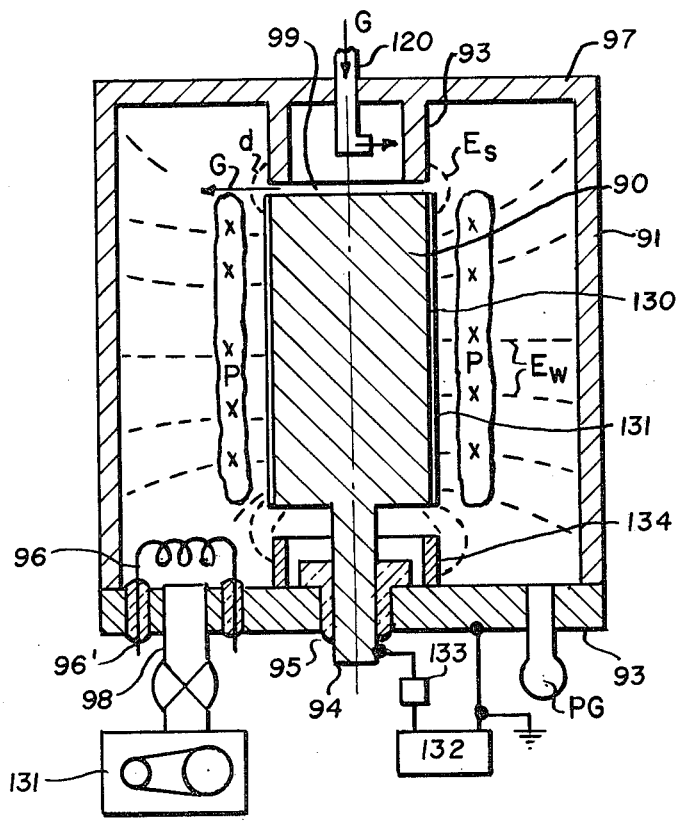
FIG. 9 is a schematic view of a second apparatus for pyrolysis of Si-bearing gases.

Referring to FIG. 9, glow-discharge deposition apparatus is illustrated that is particularly suited for coating a cylindrical substrate 90 for use as an image-forming member. The substrate 90 is made from a 6″ diameter, 18″ long aluminum cylinder, which is supported by a rod 94 in an insulated bushing 95 seated in a header 93. An enclosure 100 made from a 12″ diameter, 28″ long stainless steel tubing 91 with top plate 97, makes a vacuum-tight seal when positioned on header 93 with a suitable gasket. Cylindrical electrode 93 (electrically connected to the top plate 97) is positioned axially above the face 99 of the substrate 90 with a gap d from the top face 99, as shown. Gases G are injected radially by nozzle 120 through plate 97 from storage tanks and control valves (not shown). Suitable gases for forming a-Si:H are $SiH_4$ or disilane, and suitable Si-dopants phosphine, arsine, diborane, etc., as discussed in connection with FIG. 1. The gases G pass through the gap and are evacuated through a vacuum pump 131 connected through valved stainless steel pipe 98. A power supply 132 is connected between the supporting rod 94 of the substrate 90 and the grounded enclosure components 91, 92, 93, 97. Thus a strong electric field Es is induced in the gap d between electrodes 92, 99 and a weak field Ew to the surface of the substrate 90. In addition, heater wires 96 with suitable ceramic insulators 96′ are mounted in header 93 to pyrolize a portion of the incoming gases G to produce Si-bearing fragments which diffuse into P and augment the glow-discharge. Cylindrical shield 134 on header 93 screens the insulating bushing 95 from the Si-bearing fragments.

The operation of apparatus is similar to that described in connection with FIG. 1 in that a negative V, in the range of 500 to 1500 V, is applied to the substrate 90 to initiate a glow-discharge through the gases G at a pressure PG in the strong electric field Es. The diffuse component of the glow-discharge plasma P is then positioned in the weak field component Ew over the active face of the substrate 90 by adjusting the values of the pressure PG and V. In addition, during deposition of the a-Si:H from $SiH_4$, application of sufficient current to heater wire 96 from a power source (not shown) pyrolizes some of the $SiH_4$ and some Si-bearing fragments diffuse into the plasma P and onto the surface of the substrate 90, thereby forming coating 130. The deposition rate is enhanced by these pyrolized fragments and the electrical resistivity of a-Si:H film 130 is increased making the coating 130 particularly suited for image-forming devices. Coating 130 is deposited with the substrate 90 maintained at 180°–410° C. by a heater (not shown), or alternatively with the substrate 90 held at 30°–100° C. and subsequently annealed at 200°–300° C.

To complete an image forming P-N junction, an a-B:H layer 131 is applied by glow-discharge to the surface of the a-Si:H layer 130, as was described in connection with FIG. 2.

Under test in electrophotographic apparatus such as is shown in FIG. 7, the a-B:H top layer 131 charged negatively to a value in excess of 100 volts. Devices made in the apparatus illustrated in FIG. 9 had good image-forming properties when made with all combinations of P, I, N and blocking layers, as described in connection with FIGS. 2, 3, 6 (without electrodes 34, 44 and AR coatings 36, 46). Also, solar cells, rectifying diodes, and planar transistors made with the apparatus of FIG. 9 showed improved properties.

Finally, other B-containing gases such as $BF_3$ in $H_2$ may be used for the a-B:H for alloying with a-C:H and a-Si:H. It is relevant to note that I used $BF_3$ previously as a gaseous source for glow-discharge coating a film of boron, as described in paragraph 6 of my U.S. Pat. No. 3,069,283, issued on Dec. 18, 1962 (expired); but, the present invention depends on contacting a-Si with a-B, and preferably controlling the deposition temperature of each.

Indeed, to extend the concept further, I found that in the M/PIN structure, when the deposition temperature of the N-type layer 42 was reduced to 100° C., Voc increased by 50 mV and greater over that measured when deposited at the temperature of the I a-Si layer 43. This result is surprising since the I a-Si develops maximum Isc when deposited above 180° C.; and, in fact, it was previously accepted in the art that all a-Si films must be deposited or annealed above 180° C. to function electronically. This increase occurred with either phosphine or arsine dopant gases mixed with silane to form layer 42 using apparatus such as, for example, that illustrated in FIG. 1 or FIG. 9.

Thus, the concepts described herein form the basis of improved photovoltaic devices useful for solar energy conversion, rectifying junctions as circuit elements with both electrodes opaque, and imaging devices. Also, the P-type and N-type contacts may be used for fabricating improved bipolar transistors. Other applications and combinations are obvious to those skilled in the art, such as, for example, adding trace amounts (say 50 ppm) of a B-dopant to the I a-Si to compensate the slightly N-type conductivity. Also, the P- and N-type layers deposited at temperatures below 180° C. may be described in terms of their hydrogen content since the H/B ratio of amorphous boron deposited at 280° C. is 30% and the H/Si ratio of H/Si deposited at 250° C. is 30%. Both a-B:H and a-Si doped with boron or with phosphorus or As have a higher hydrogen content.

I claim:

1. A semiconductor device comprising a body of hydrogenated amorphous silicon having a surface portion in contact with a body of amorphous boron to form a semiconductor junction.

2. The semiconductor device in claim 1 in which a second surface portion of said hydrogenated amorphous silicon is in contact with N-type silicon to form an ohmic contact.

3. The semiconductor device in claim 1 in which said hydrogenated amorphous boron is deposited on a conducting substrate.

4. The semiconductor device in claim 1 in which said hydrogenated amorphous boron accepts a negative electrostatic charge and said amorphous silicon is photoconductively responsive selectively to electromagnetic radiation to form an image of said charge.

5. The semiconductor device in claim 1 in which said hydrogenated amorphous boron accepts a negative electrostatic charge and said hydrogenated amorphous silicon is photoconductively responsive to an X-ray pattern to form an image of said charge.

6. The semiconductor device in claim 1 in which a metallic contact is applied to said hydrogenated amorphous boron.

7. The semiconductor device in claim 2 in which a semitransparent metallic contact is applied to said hydrogenated amorphous boron.

8. The semiconductor device in claim 7 in which an anti-reflection coating is applied to said transparent metallic coating.

9. The semiconductor device in claim 4 in which a dielectric coating is applied to said hydrogenated amorphous boron to facilitate said image formation.

10. The semiconductor device in claim 1 in which a dielectric barrier is interposed between one of said bodies and an electrode.

11. The semiconductor device in claim 1 in which said body of hydrogenated amorphous silicon is doped.

12. The semiconductor device in claim 3 in which said substrate is opaque.

13. A semiconductor device comprising a body of hydrogenated amorphous silicon having one surface in contact with a body comprising boron to develop a semiconductor junction with enhanced open-circuit voltage.

14. The semiconductor device in claim 13 in which a dielectric barrier is interposed between one of said bodies and an electrode.

15. The semiconductor device in claim 13 in which a second surface portion of said hydrogenated amorphous silicon is contacted ohmically with an N-type semiconductor.

16. The device in claim 15 in which said N-type semiconductor is contacted by a second N-type semiconductor of a second said device.

17. The semiconductor device of claim 15 in which a semitransparent electrode is in contact with said ohmic contact and an opaque electrode is in contact with a surface portion of said body comprising boron to form a solar cell.

18. The semiconductor device of claim 15 in which a semitransparent electrode is in contact with a surface of said body comprising boron and a second electrode is in contact with said ohmic electrode.

19. The semiconductor device in claim 15 in which said N-type semiconductor is deposited at a temperature below 180° C.

20. The semiconductor device in claim 15 in which said N-type semiconductor has a hydrogen content in excess of 30%.

21. The semiconductor device in claim 13 in which said body comprising boron has a hydrogen content in excess of 32%.

22. The semiconductor device in claim 13 further comprising a substrate having a conducting portion in which said body comprising boron is disposed between said body of hydrogenated amorphous silicon and said conducting portion of said substrate.

23. The semiconductor device in claim 22 in which said conducting portion of said substrate is opaque.

24. The semiconductor device in claim 13 in which said body of hydrogenated amorphous silicon is doped.

25. A photoresponsive device comprising a body of hydrogenated amorphous silicon having one surface in contact with a body comprising boron to form a semiconductor junction therebetween and in which electromagnetic radiation is admitted into said P-N junction through said body of hydrogenated amorphous silicon.

26. The photoresponsive device in claim 25 in which a dielectric barrier is interposed between one of said bodies and an electrode.

27. The photoresponsive device in claim 25 in which a surface portion of said body comprising boron is contacted with an opaque electrode.

28. The photoresponsive device in claim 27 in which said electrode is stainless steel.

29. The semiconductor device of claim 25 in which said hydrogenated amorphous silicon is doped.

30. The semiconductor device in claim 25 further comprising a conducting substrate in which said body comprising boron is disposed on said conducting substrate.

31. The semiconductor device in claim 30 in which said conducting substrate is opaque.

32. A semiconductor device comprising a body of hydrogenated amorphous silicon having one surface in contact with a body comprising boron and carbon to develop a semiconductor junction with enhanced open circuit voltage.

33. The semiconductor device in claim 32 further comprising a conducting substrate in which said body comprising boron and carbon is positioned between said body of hydrogenated amorphous silicon and said conducting substrate.

34. The semiconductor device in claim 33 in which said conducting substrate is opaque.

35. A photoresponsive device comprising a body of hydrogenated amorphous silicon having one surface in contact with a body comprising boron and carbon to develop a semiconductor junction therebetween and in which electromagnetic radiation is admitted into said semiconductor junction through said hydrogenated amorphous silicon.

36. The photoresponsive device in claim 35 in which said body comprising boron and carbon is disposed on an opaque conducting substrate.

37. The photoresponsive device in claim 35 further comprising an electrode in which a dielectric barrier is interposed between one of said bodies and an electrode.

* * * * *

REEXAMINATION CERTIFICATE (3858th)

United States Patent [19]

Coleman

[11] B1 4,330,182
[45] Certificate Issued  Sep. 7, 1999

[54] METHOD OF FORMING SEMICONDUCTING MATERIALS AND BARRIERS

[75] Inventor: John H. Coleman, Locust Valley, N.Y.

[73] Assignee: Plasma Physics Corporation, Locust Valley, N.Y.

Reexamination Request:
No. 90/002,399, Aug. 13, 1991

Reexamination Certificate for:
Patent No.: 4,330,182
Issued: May 18, 1992
Appl. No.: 06/138,699
Filed: Apr. 9, 1980

Related U.S. Application Data

[63] Continuation-in-part of application No. 05/857,690, Dec. 5, 1977, Pat. No. 4,226,897.

[51] Int. Cl.$^6$ .......................... H01L 29/04; H01L 25/00; G03G 15/02
[52] U.S. Cl. ................... 257/56; 257/53; 257/74; 136/249; 136/258; 430/57; 430/66; 430/84
[58] Field of Search ................... 257/53, 56, 74; 136/249, 258; 430/57, 66, 84

[56] References Cited

U.S. PATENT DOCUMENTS

| | | | |
|---|---|---|---|
| 4,064,521 | 12/1977 | Carlson | 357/2 X |
| 4,069,492 | 1/1978 | Pankove | 352/2 X |
| 4,109,271 | 8/1978 | Pankove | 357/2 |
| 4,117,506 | 9/1978 | Carlson et al. | 357/30 |
| 4,142,195 | 2/1979 | Carlson | 357/2 X |
| 4,162,505 | 7/1979 | Hanak | 352/2 X |
| 4,177,474 | 12/1979 | Ovshinsky | 357/61 |
| 4,196,438 | 4/1980 | Carlson | 357/2 X |
| 4,202,928 | 5/1980 | Staebler | 357/2 X |
| 4,217,148 | 8/1980 | Carlson | 357/2 X |
| 4,217,374 | 8/1980 | Ovshinsky et al. | 437/2 |
| 4,251,229 | 2/1981 | Moustakas | 352/2 X |
| 4,266,984 | 5/1981 | Wronski | 357/2 X |
| 4,329,699 | 5/1982 | Ishihara | 357/2 |

OTHER PUBLICATIONS

D.E. Carlson and C.R. Wronski, "Amorphous Silicon Solar Cell", *Appl. Phys. Lett.*, vol. 28, No. 11, Jun. 1, 1976.

D.E. Carlson, "Factors Influencing the Efficiency of Amorphous Silicon Solar Cells", Journal of Non–Crystalline Solids 35 & 36 (1980) pp. 707–717.

J.I. Pankove and D.E. Carlson, "Photoluminescence of Hydrogenated Amorphous Silicon", *Appl. Phys. Lett.*, vol. 31, No. 7, Oct. 1, 1977.

D.E. Carlson et al., "The Effect of Hydrogen Content on the Photovoltaic Properties of Amorphous Silicon", *Solid–State Science and Technol.*, vol. 126, No. 4, Apr., 1979.

Brodsky, *IBM Tech. Bull.*, vol. 17, No. 16, Nov. 1974 pp. 1814–1816.

*Primary Examiner*—Steven Loke

[57] ABSTRACT

Photovoltaic junctions useful for solar energy conversion and for electrophotographic image formation are fabricated from a layer of amorphous boron in contact with a layer of amorphous silicon. The amorphous boron is preferably deposited at a reduced temperature on the amorphous silicon; or, alternatively, the amorphous silicon is deposited on a boron-bearing body previously deposited on an opaque metallic substrate.

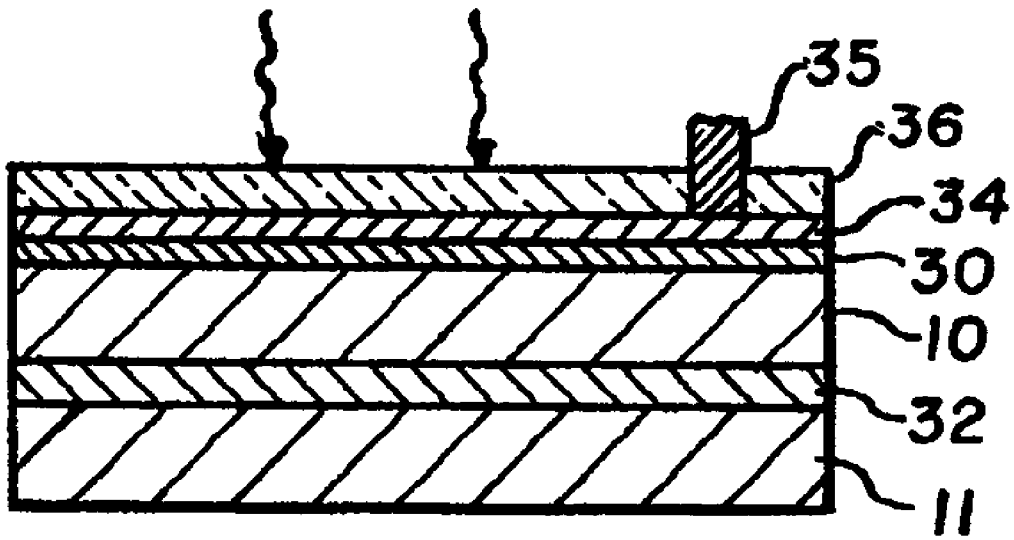

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 16, 25–31, 34–37 is confirmed.

Claims 13–15, 17–24, 32 and 33 are cancelled.

Claim 1 is determined to be patentable as amended.

Claims 2–12 dependent on an amended claim, are determined to be patentable.

New claims 38–53 are added and determined to be patentable.

1. A semiconductor device comprising a body of hydrogenated amorphous silicon having a surface portion in contact with a body of *hydrogenated* amorphous boron to form a semiconductor junction.

*38. The semiconductor device in claim 15 in which said N-type semiconductor comprises crystallites essentially free of poly-crystallites on a macro-scale.*

*39. The semiconductor device in claim 15 in which said N-type semiconductor comprises crystallites essentially free of poly-crystallites on a macro-scale with surface roughness.*

*40. The semiconductor device in claim 13 in which said body comprising boron comprises crystallites essentially free of poly-crystallites on a macro-scale with surface roughness.*

*41. The semiconductor device in claim 13 in which said body comprising boron comprises an amorphous phase and a crystalline phase and in which said crystalline phase is essentially free of poly-crystallites on a macro-scale with surface roughness.*

*42. The semiconductor device of claim 13 in which said body comprising boron is fabricated by means of a glow discharge in a gaseous mixture comprising boron trifluoride.*

*43. The semiconductor device in claim 32 in which said body comprising boron and carbon comprises crystallites essentially free of poly-crystallites on a macro-scale.*

*44. The semiconductor device in claim 32 in which said body comprising boron and carbon comprises an amorphous phase and a crystalline phase and in which said crystalline phase is essentially free of poly-crystallites on a macro-scale with surface roughness.*

*45. The semiconductor device comprising hydrogenated amorphous silicon having one surface in contact with a body comprising boron, silicon and hydrogen to develop a semiconductor junction, in which said body comprising boron, silicon and hydrogen comprises crystallites essentially free of poly-crystallites on a macro-scale with surface roughness.*

*46. The semiconductor device comprising hydrogenated amorphous silicon having one surface in contact with a body comprising boron, silicon, carbon and hydrogen to develop a semiconductor junction, in which said body comprising boron, silicon, carbon and hydrogen comprises crystallites essentially free of poly-crystallites on a macro-scale with surface roughness.*

*47. A semiconductor device comprising a body comprising hydrogenated amorphous silicon having one surface in contact with a body comprising boron to develop a semiconductor junction, in which said body comprising boron comprises crystallites deposited at a temperature below about 600° C.*

*48. A semiconductor device comprising a body comprising hydrogenated amorphous silicon having one surface in contact with a body comprising boron in which a second surface portion of said body comprising hydrogenated amorphous silicon is contacted ohmically with an n-type semiconductor and in which said body comprising boron comprises crystallites deposited at a temperature below about 600° C.*

*49. A semiconductor device comprising a body comprising hydrogenated amorphous silicon having one surface in contact with a body comprising boron in which a second surface portion of said body comprising hydrogenated amorphous silicon is contacted ohmically with an n-type semiconductor and in which said n-type semiconductor comprises crystallites deposited at a temperature below 600° C.*

*50. A semiconductor device comprising a body comprising hydrogenated amorphous silicon having one surface in contact with a body comprising boron to develop a semiconductor junction, in which said body comprising boron is fabricated by means of a glow discharge in a gaseous mixture comprising boron trifluoride.*

*51. A semiconductor device comprising a body comprising hydrogenated amorphous silicon having one surface portion in contact with a body comprising boron to form a semiconductor junction in which said body comprising boron comprises hydrogenated amorphous boron.*

*52. A photoresponsive device comprising a body of hydrogenated amorphous silicon having one surface in contact with a body comprising boron to form a semiconductor junction therebetween and in which electromagnetic radiation is admitted into said semiconductor junction through said body of hydrogenated amorphous silicon in which said body comprising boron comprises hydrogenated amorphous boron.*

*53. A semiconductor device comprising a body comprising hydrogenated amorphous silicon having one surface portion in contact with a body comprising boron and carbon to form a semiconductor junction in which said body comprising boron and carbon comprises hydrogenated amorphous boron.*

* * * * *